(12) United States Patent
Nakamura

(10) Patent No.: US 8,826,742 B2
(45) Date of Patent: Sep. 9, 2014

(54) PRESSURE SENSOR USING MEMS RESONATOR

(71) Applicant: Panasonic Corporation, Osaka (JP)

(72) Inventor: Kunihiko Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/000,673

(22) PCT Filed: Feb. 12, 2013

(86) PCT No.: PCT/JP2013/000742
§ 371 (c)(1),
(2), (4) Date: Aug. 21, 2013

(87) PCT Pub. No.: WO2013/132746
PCT Pub. Date: Sep. 12, 2013

(65) Prior Publication Data
US 2014/0202260 A1    Jul. 24, 2014

(30) Foreign Application Priority Data
Mar. 7, 2012  (JP) ................. 2012-050332

(51) Int. Cl.
*G01B 7/16* (2006.01)
*G01L 1/16* (2006.01)
*B81B 3/00* (2006.01)
*G01L 1/10* (2006.01)

(52) U.S. Cl.
CPC ............ *G01L 1/162* (2013.01); *B81B 3/0021* (2013.01)
USPC .......................................... 73/777; 73/862.59

(58) Field of Classification Search
CPC ..... G01B 9/02004; G01G 3/16; G01S 13/753
USPC ...................... 73/760, 777, 862.59
See application file for complete search history.

(56) References Cited

U.S. PATENT DOCUMENTS 7,358,648 B2   4/2008 Nakamura et al.
7,463,798 B2 *  12/2008 Yoshida .................. 385/18
(Continued)

FOREIGN PATENT DOCUMENTS

JP   3-4090    1/1991
JP   11-23313  1/1999
(Continued)

OTHER PUBLICATIONS

O. Paul, O. Brand, R.Lenggenhager, and H. Baltes, "Vacuum Gauging with Complementary Metal-Oxide-Semiconductor Microsensors", J. Vac. Sci. Technol. A, American Vacuum Society, May/Jun. 1995, 13(3), pp. 503-508.

(Continued)

*Primary Examiner* — Max Noori
(74) *Attorney, Agent, or Firm* — Wenderoth, Lind & Ponack, L.L.P.

(57) ABSTRACT

A pressure sensor including: a MEMS resonator; a sweeping unit which sweeps a frequency of an excitation signal in a predetermined direction of sweeping, over a predetermined frequency range including a resonance frequency f0 of a vibrator in the MEMS resonator, while outputting the excitation signal to the MEMS resonator; an integrating unit which inputs a vibrating-state information signal as a characteristic amount indicative of a vibrating state of the vibrator from the MEMS resonator while the sweeping unit sweeps the frequency, integrates a plurality of the vibrating-state information signals at different frequencies of the excitation signal, and outputs the integrated value; and a conversion unit adapted to determine a pressure acting on the MEMS resonator, based on the integrated value.

10 Claims, 13 Drawing Sheets

(56) References Cited

U.S. PATENT DOCUMENTS

| | | | |
|---|---|---|---|
| 7,843,283 B2* | 11/2010 | Reichenbach et al. | 333/186 |
| 7,907,019 B1* | 3/2011 | Brown | 331/18 |
| 8,542,074 B2* | 9/2013 | Nakamura | 331/154 |
| 8,606,410 B2* | 12/2013 | Drouin et al. | 700/280 |
| 2007/0188272 A1 | 8/2007 | Nakamura et al. | |
| 2010/0321750 A1* | 12/2010 | Burinskiy et al. | 359/198.1 |
| 2012/0176609 A1* | 7/2012 | Seppa et al. | 356/227 |

FOREIGN PATENT DOCUMENTS

| | | |
|---|---|---|
| JP | 2007-171059 | 7/2007 |
| JP | 2010-127795 | 6/2010 |
| WO | 2006/075717 | 7/2006 |

OTHER PUBLICATIONS

M. Agarwal, K. Park, R. Candler, M. Hoperoft, C. Jha, R. Melamud, B. Kim, B. Murrnann, and T. W. Kenny, "Non-Linearity Cancellation in MEMS Resonators for Improved Power-Handling", Electron Devices Meeting 2005 IEDM Technical Digest, IEEE International, pp. 286-289.

Written Opinion of the International Searching Authority mailed Mar. 19, 2013 in International (PCT) Application No. PCT/JP2013/000742.

International Search Report mailed Mar. 19, 2013 in International (PCT) Application No. PCT/JP2013/000742.

\* cited by examiner

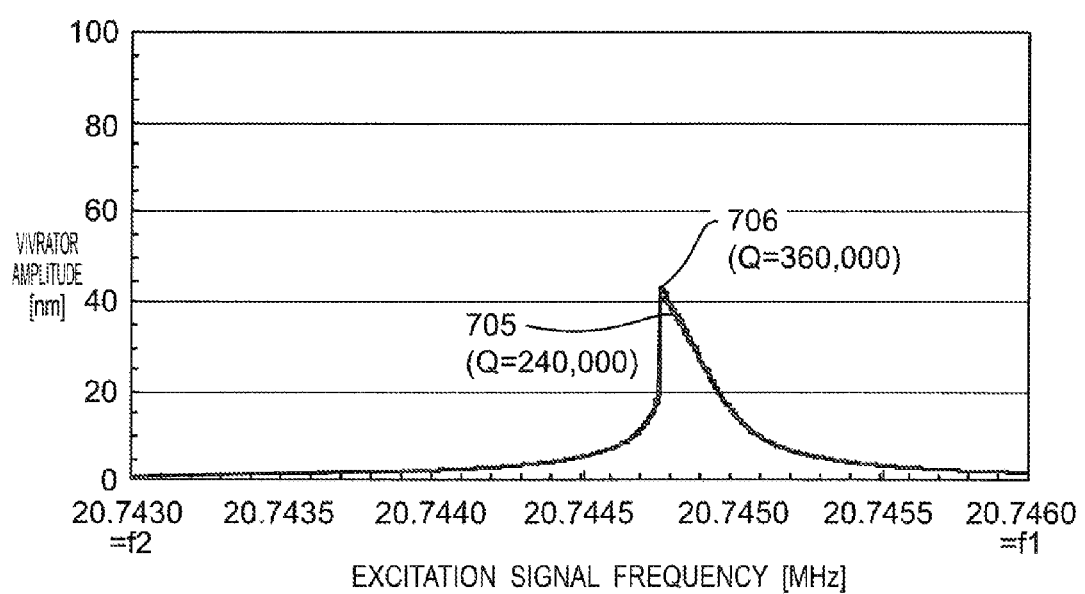

PRESSURE SENSOR USING MEMS RESONATOR

TECHNICAL FIELD

The technical field relates to a pressure sensor and, more particularly, relates to a pressure sensor employing a mechanical resonator such as MEMS (Micro-Electro Mechanical Systems) resonator.

BACKGROUND ART

Conventionally, there have been known mechanical resonators employing micro mechanical vibrators (micro mechanical resonators or MEMS resonators) (Patent Literature 1).

FIG. 17A and FIG. 17B are views illustrating an example of the structure of a conventional MEMS resonator 100. The MEMS resonator 100 is a so-called capacitance-type MEMS resonator. FIG. 17A is a perspective view of the MEMS resonator 100, and FIG. 17B is a side cross-sectional view of the MEMS resonator 100 taken along the line A-A' in FIG. 17A. Further, in FIG. 17B, there are not illustrated a BOX (Buried Oxide) layer 104 and a silicon substrate 105, while there are additionally illustrated a voltage Vi inputted to the MEMS resonator 100, an electric current io outputted therefrom, a bias voltage Vp applied to a vibrator 101, the direction of vibrations of the vibrator 101, and the like.

The MEMS resonator 100 can be fabricated using an SOI (Silicon On Insulator) substrate. In this case, the beam-type vibrator 101, an input electrode 102 and an output electrode 103 are formed from the uppermost Si layer in the SOI substrate. Further, the BOX (Buried Oxide) layer 104 under the vibrator 101 has been etched away, and the vibrator 101 is held by a supporting portion 101s on a remaining portion of the BOX layer 104, such that the vibrator 101 can vibrate. The vibrator 101 is anchored, together with the electrodes 102 and 103, to the silicon substrate 105, through the remaining portion of the BOX layer 104.

The mechanism for vibrating the vibrator 101 will be described, with reference to FIG. 17B. The vibrator 101 is placed such that it faces the input electrode 102 and the output electrode 103 with cavities (gaps) gi and go interposed therebetween, and the bias voltage Vp is applied to the vibrator 101 in such a way as to provide a DC electric-potential difference between the input electrode 102 and the output electrode 103. When the AC input voltage (AC voltage) Vi is applied to the input electrode 102, the electric-potential difference between the vibrator 101 and the input electrode 102 is changed according to the AC input voltage Vi, which exerts, on the vibrator 101, an excitation force caused by an electrostatic force. When the frequency of the AC input voltage Vi is coincident with the mechanical resonance frequency of the vibrator 101, the vibrator 101 largely vibrates (resonates), in the direction of vibrations 106. At this time, a displacement current io is flowed to the output electrode 103 from the capacitance Co formed by the cavity go.

Applications of the MEMS resonator 100 include filter circuits which utilize the fact that electricity passing characteristics between the input and output electrodes are increased only around a certain frequency, namely around the resonance frequency of the vibrator, temperature sensors which utilize the fact that the resonance frequency of the vibrator is shifted with the temperature, pressure sensors which utilize the fact that the resonance frequency of the vibrator is shifted due to stresses acting on the vibrator, mass sensors which utilize the fact that the resonance frequency of the vibrator is shifted due to minute quantities of substances adhered to the vibrator, and the like.

Non-Patent Literature 1 suggests a possibility of realization of a pressure sensor employing a MEMS resonator. According to the same, the vibrating motion (for example, resonating motion) of the vibrator in the MEMS resonator is changed, in terms of its characteristics (for example, the Q factor and the magnitude of the amplitude of the vibrating motion), depending on the pressure of the ambient atmosphere surrounding the vibrator. More specifically, in the MEMS resonator, the kinetic energy or the kinetic momentum of the vibrator performing resonant motion is dissipated through the viscosity of the ambient atmosphere surrounding the vibrator, and the degree of the dissipation is varied depending on the pressure of the ambient atmosphere. Therefore, the amplitude of the vibrator resonating at the resonance frequency is varied depending on the pressure of the ambient atmosphere. Accordingly, in the MEMS resonator resonating around the resonance frequency, the amplitude of the vibrator, the Q factor and other quantities thereof well correspond to the pressure of the ambient atmosphere. Accordingly, by detecting the amplitude of the vibrator or the Q factor thereof, in the MEMS resonator resonating in the ambient atmosphere, it is possible to determine the pressure of the ambient atmosphere. For example, FIG. 4 in Non-Patent Literature 1 illustrates a correspondence relationship between the Q factor of the MEMS resonator and the pressure of the ambient atmosphere.

Further, Non-Patent Literature 2 describes nonlinear behaviors of a MEMS resonator which appear in cases where the vibrator in the MEMS resonator is vibrated at relatively-larger amplitudes. In general, when the vibration amplitude of the vibrator 101 in the MEMS resonator 100 is sufficiently smaller, such nonlinear effects have small influences enough to be negligible (in a linear region), and its resonance characteristic obtained by sweeping of the frequency of the input voltage Vi has a profile which is bilaterally symmetric about a peak at the resonance frequency f0 of the vibrator 101 and, thus, exhibits no hysteresis depending on the direction of the sweeping, as a resonance characteristic 111 in FIG. 18. However, if the Q factor of the vibrator is increased so that its vibration amplitude is increased to be equal to or more than a certain magnitude (if it enters a nonlinear region), its resonance characteristic (such as resonance curves 121 and 131) exhibits prominent nonlinearity, as illustrated in FIG. 19 and FIG. 20. For example, when the vibrator 101 in the capacitance-type MEMS resonator 100 is performing vibrating motion in the nonlinear region, its resonance characteristic exhibits hysteresis (123 and 125) depending on the direction of the frequency sweeping, and its vibration amplitude has no obvious peak at the resonance frequency f0.

According to Non-Patent Literature 2, such nonlinear phenomena are caused by two types of nonlinear effects. One of them is an effect (Capacitive Bifurcation) of causing the input electrode 102 and the output electrode 103 to excessively draw the vibrator 101 thereinto, when the vibration amplitude of the vibrator 101 is larger. The other one of them is an effect (Mechanical Bifurcation) of the increase of the rigidity of the vibrator 101 along with the increase of the vibration amplitude of the vibrator 101. Only one of these two types of nonlinear effects may be induced, and, also, both of them may be induced at the same time, depending on the structure of the MEMS resonator.

FIG. 19 is an example of a resonance characteristic 121 of the MEMS resonator 100, when there is prominent capacitive bifurcation. In this case, the resonance characteristic is warped such that it falls leftwardly (toward a lower-frequency side) and, thus, exhibits hysteresis (arrows 123 and 125) due to the difference of the direction of the frequency sweeping, and the peak of the vibration amplitude is shifted toward a lower frequency than the resonance frequency f0.

FIG. 20 is an example of a resonance characteristic 131 of the MEMS resonator, when there is prominent mechanical bifurcation. In this case, the resonance characteristic is warped such that it falls rightwardly (toward a higher-frequency side) and, thus, exhibits hysterisis (arrows 133 and 135) due to the difference of the direction of the frequency sweeping, and the peak of the vibration amplitude is shifted toward a higher frequency than the resonance frequency f0.

CITATION LIST

Patent Literature

PTL 1: WO 2006/075717 A

Non Patent Literature

NPL 1: O. Paul, O. Brand, R. Lenggenhager, and H. Baltes, "Vacuum gauging with complementary metal-oxide-semiconductor microsensors", J. Vac. Sci. Technol. A, American Vacuum Society, May/June 1995, 13(3), p. 503-508.

NPL 2: N. Agarwal, K. Park, R. Candler, M. Hoperoft, C. Jha, R. Melamud, B. Kim, B. Murmann, and T. w. Kenny, "Non-Linearity Cancellation in MEMS Resonators for Improved Power-Handling", Electron Devices Meeting 2005 IEDM Technical Digest, IEEE International, P. 286-289.

SUMMARY OF INVENTION

Technical Problem

For example, in the MEMS resonator 100 (the capacitance-type MEMS resonator) adapted to exert, on the vibrator 101, an electrostatic force varying with the AC input voltage Vi for exciting the vibrator 101, as illustrated in FIG. 17A and FIG. 17B, in general, if the vibration amplitude of the vibrator 101 gets to be equal to or more than ⅓ the size of the cavities (the gaps) go and gi, prominent nonlinearity due to the effect of capacitive bifurcation appears. Namely, in cases where the vibrator 101 in the so-called capacitance-type MEMS resonator performs vibrating motion, when the vibration amplitude has just exceeded ⅓ the size of the cavities (the gaps) go and gi, its nonlinearity becomes prominent, and its resonance characteristic becomes a resonance characteristic 121 which is bilaterally asymmetric and exhibits hysteresis in the direction of sweeping, as illustrated in FIG. 19. Therefore, around the resonance frequency f0, the vibration amplitude of the vibrator 101 is not stabilized, which destabilizes the output of the MEMS resonator 100.

Further, when the vibrator 101 is vibrating in the nonlinear region, the amplitude of the vibrator 101 around the resonance frequency f0 of the vibrator 101 is hardly changed, even if the pressure of the ambient atmosphere is changed.

Therefore, with conventional pressure sensors which are adapted to apply an AC input voltage at predetermined frequency (for example, a frequency near the resonance frequency f0) to a MEMS resonator 100 and, further, are adapted to determine the pressure of an ambient atmosphere based on the output from the MEMS resonator 100, it is extremely hard to perform pressure measurement under an ambient-atmosphere pressure which causes the vibrator 101 in the MEMS resonator 100 to vibrate in a nonlinear region. Therefore, with such conventional pressure sensors, the measurable pressure range has been limited to a range which allows the vibrator 101 to vibrate within a linear region, such as a range which prevents the vibration amplitude of the vibrator 101 in resonance states from exceeding ⅓ the sizes of the cavities go and gi, for example.

In view of the aforementioned circumstances, according to the present embodiment, there is provided a pressure sensor employing a MEMS resonator and being capable of measuring the pressure of the ambient atmosphere, even when the vibration amplitude of the vibrator exceeds ⅓ the size of cavities go and gi, namely even under pressures which cause the vibrator in the MEMS resonator to operate in a nonlinear region, as well as in a linear region.

Solution to Problem

The present embodiment is a pressure sensor employing a MEMS resonator. The pressure sensor employing a MEMS resonator includes: a MEMS resonator; a sweeping unit which sweeps a frequency of an excitation signal in a predetermined direction of sweeping, over a predetermined frequency range including a resonance frequency f0 of a vibrator in the MEMS resonator, while outputting the excitation signal to the MEMS resonator; an integrating unit which inputs a vibrating-state information signal as a characteristic amount indicative of a vibrating state of the vibrator from the MEMS resonator while the sweeping unit sweeps the frequency, integrates a plurality of the vibrating-state information signals at different frequencies of the excitation signal, and outputs the integrated value; and a conversion unit which determines a pressure acting on the MEMS resonator, based on the integrated value.

Advantageous Effects of Invention

The pressure sensor according to the embodiment is adapted to integrate a plurality of vibrating-state information signals at different frequencies of an excitation signal and, further, is adapted to determine the pressure of an ambient atmosphere surrounding a vibrator based on the integrated value. By doing this, the pressure sensor according to the embodiment is capable of measuring the pressure of the ambient atmosphere, even under pressures which cause the vibrator in the MEMS resonator to operate in a nonlinear region.

BRIEF DESCRIPTION OF DRAWINGS

FIG. 6 is resonance characteristics of the vibrator in the MEMS resonator under various pressures.

DESCRIPTION OF EMBODIMENTS

1. General Outlines 1-1. The Principle of Operations of a Pressure Sensor Employing a MEMS Resonator The present embodiment mainly relates to sensors utilizing the fact that vibrating states (for example, the amplitude) of a vibrator in a MEMS resonator reflects the amount desired to be detected. This sensor is a pressure sensor for measuring the pressure of an ambient atmosphere, for example. The vibrations of the vibrator in the MEMS resonator in an ambient atmosphere are subjected to damping due to the viscosity of the ambient atmosphere. Therefore, the vibration amplitude and the speed of the vibrator depend on the pressure of the ambient atmosphere. More specifically, there is the relationship of $Q \propto$ (proportional to) $(1/P)$ between the pressure P of the ambient atmosphere, and the Q factor indicative of the acuteness of the resonation of the MEMS resonator. Further, the vibration amplitude X during resonance has the relationship $X \propto$ (proportional to) Q therewith. Accordingly, there is held the relationship $X \propto$ (proportional to) $(1/P)$, and as the pressure of the ambient atmosphere is decreased, the acuteness of the resonance is increased, and the vibration amplitude X is also increased. If the vibration amplitude X is increased, the speed of the vibrations of the vibrator is similarly increased. The pressure sensor employing the MEMS resonator according to the present embodiment utilizes this principle.

1-2. Problems of a Pressure Sensor which Employs a MEMS Resonator

Figure 1:
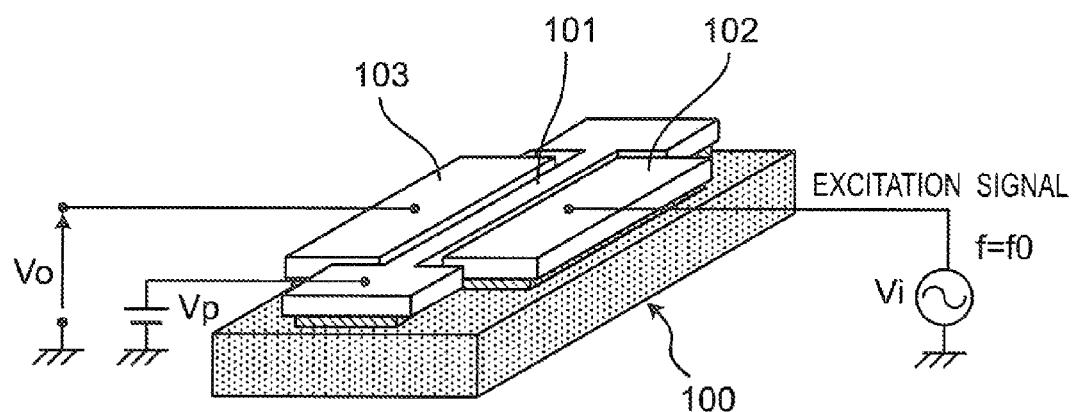
FIG. 1 is an example of the structure of a pressure sensor employing a MEMS resonator.
Figure 17A:
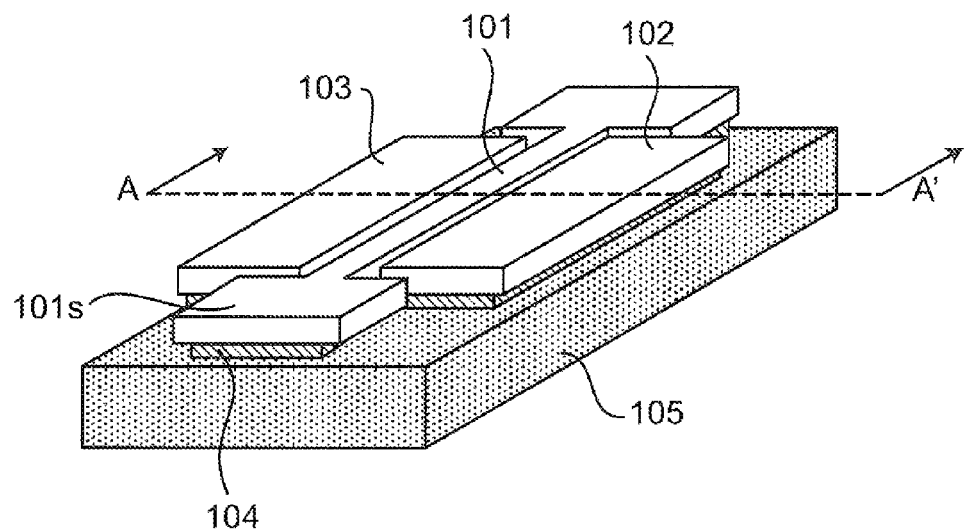
FIG. 17A is a perspective view illustrating the structure of a capacitance-type MEMS resonator.

FIG. 1 is a view illustrating the structure of a pressure sensor 200 which is adapted to apply an excitation signal (AC voltage) Vi with a fixed frequency f0 to an input electrode 102 in a MEMS resonator 100 as in FIG. 17A and, further, is adapted to extract, as a voltage Vo, information about the vibrating motion of a vibrator 101 at this time (for example, information about the vibration amplitude).

In this case, the frequency f of the excitation signal (the AC voltage) Vi is made coincident with the mechanical resonance frequency f0 of the vibrator 101 (f=f0). Further, the maximum value (the amplitude) of the AC input voltage (the excitation signal) Vi is fixed to a constant value. Assuming that the vibrator 101 exists in the ambient atmosphere, an output AC voltage Vo with a magnitude corresponding to the pressure P of the ambient atmosphere is outputted from an output electrode 103 in the structure 200. Accordingly, by preliminarily determining the relationship between the magnitude of the output AC voltage Vo and the pressure P of the ambient atmosphere, it is possible to determine the pressure P of the ambient atmosphere based on the output AC voltage Vo.

Figure 2:
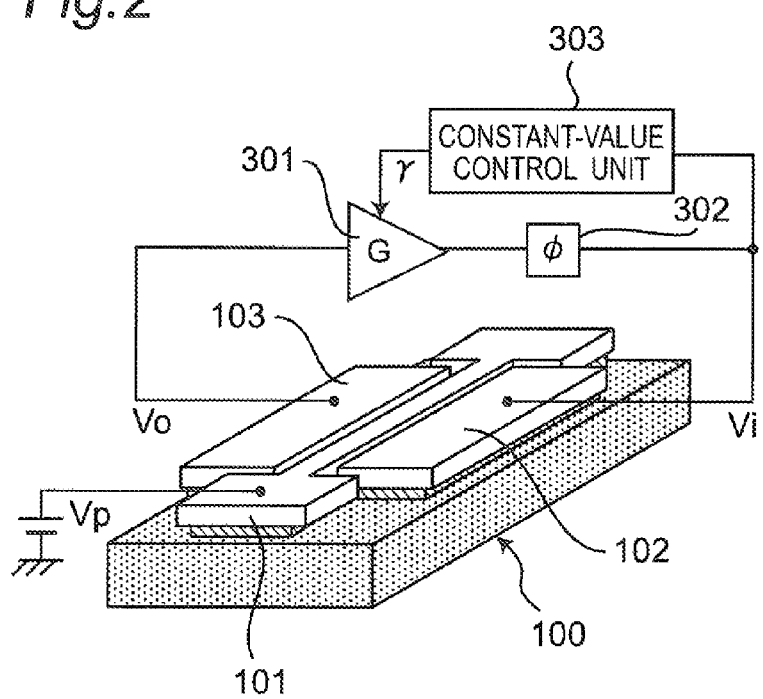
FIG. 2 is another example of the structure of a pressure sensor employing a MEMS resonator.

FIG. 2 is a view illustrating the structure of another example 300 of the pressure sensor. In the pressure sensor 300, there is no need for an excitation signal source included in the structure of the pressure sensor 200 illustrated in FIG. 1. The present structure is adapted to feed back the signal outputted from an output electrode 103 in a MEMS resonator 100 to an input electrode 102 through an amplifier G (301) and a phase adjusting device φ (302), thereby oscillating the MEMS resonator 100 at a frequency f0. A constant-value control unit 303 is provided for maintaining the input voltage Vi (the maximum amplitude thereof) constant. The constant-value control unit 303 observes the input voltage Vi as the excitation signal and outputs a gain command signal γ for adjusting the gain of the amplifier G (301), such that the maximum amplitude of the input voltage Vi is maintained constant. As the pressure P of the ambient atmosphere decreases (increases), the vibration amplitude of the vibrator 101 in the MEMS resonator 100 is increased (decreased). Therefore, the signal outputted from the output electrode 103 is increased (decreased), with decreasing (increasing) pressure P. On the other hand, the constant-value control unit 303 adjusts the gain of the amplifier G (301) for maintaining the maximum amplitude of the input voltage Vi constant. Therefore, the value of the gain command signal γ depends on the pressure P of the ambient atmosphere. Accordingly, with the pressure sensor 300, the pressure P can be determined, from the value of the gain command signal γ.

However, regarding the pressure detection utilizing the relationship of $X \propto$ (proportional to) Q which holds between the Q factor of the MEMS resonator 100 and the amplitude X of the vibrator 101 during resonance, the pressure range which can be detected is limited for the following reason.

Figure 18:
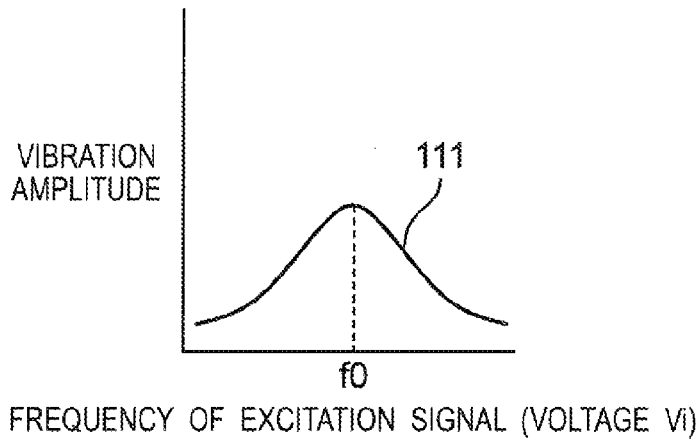
FIG. 18 is a graph illustrating a resonance characteristic in a linear region.
Figure 19:
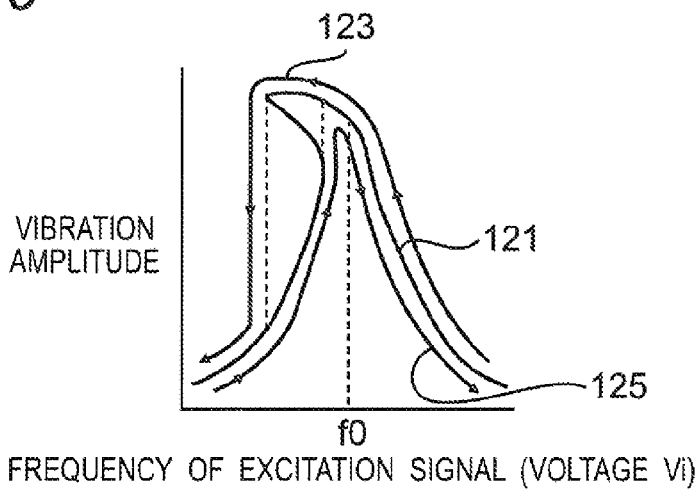
FIG. 19 is a view illustrating resonance characteristics and hysteresis which appear in a nonlinear region.

In cases of sweeping the frequency of the excitation signal (the voltage Vi) and exciting the vibrator 101 in the MEMS resonator 100 at a sufficiently smaller amplitude (within a linear region), as illustrated in FIG. 18, its resonance characteristic 111 is bilaterally symmetric about the resonance frequency f0 of the vibrator 101, wherein no hysteresis appears therein depending on the direction of the sweeping. However, for example, if the Q factor of the MEMS resonator 100 is increased, due to decreases of the ambient atmosphere pressure P or the like, which increases the vibration amplitude of the vibrator 101 to a certain extent or more (if it enters a nonlinear region), its resonance characteristic 121 exhibits prominent nonlinearity, and hysteresis appears therein, depending on the difference in the direction of the sweeping of the frequency of the input voltage Vi, as illustrated in FIG. 19. Such a nonlinearity phenomenon as illustrated in FIG. 19 is caused by an effect (capacitive bifurcation) as follows. That is, in a state where a constant electrostatic force, namely an electrostatic force caused by a DC electric-potential difference (a bias voltage) Vp, is continuously applied to the vibrator 101, if the vibrator 101 gets too close to the electrode 102 or 103, this constant electrostatic force excessively acts on the vibrator 101, and the electrode 102 or 103 tries to draw the vibrator 101 therein.

If the effect of the capacitive bifurcation becomes more prominent, the resonance curve 121 is inclined toward a lower-frequency side, around the peak. Further, if the Q factor is further increased (for example, if the pressure P is further decreased), the resonance characteristic 121 exhibits increased warpage toward the lower-frequency side. On the other hand, the amplitude value is hardly changed, around the resonance frequency f0. Therefore, if the vibrating motion of the vibrator 101 enters a nonlinear region, the change of the amplitude of the vibrator 101 is slackened, which makes it harder to perform accurate pressure measurements, as long as the output is observed while the frequency of the excitation signal Vi is fixed at the resonance frequency f0, in the pressure sensor 200.

Further, with the structure of the pressure sensor 300 illustrated in FIG. 2, if the vibrating motion of the vibrator 101 enters a nonlinear region, as indicated by the resonance characteristic 121 in FIG. 19, it is impossible to generate stable oscillations thereof due to the existence of two or more vibrating conditions for a single frequency, which degrades the stability of the frequency of the oscillating signal (Vo), thereby disabling pressure sensing operations thereof.

Figure 17B:
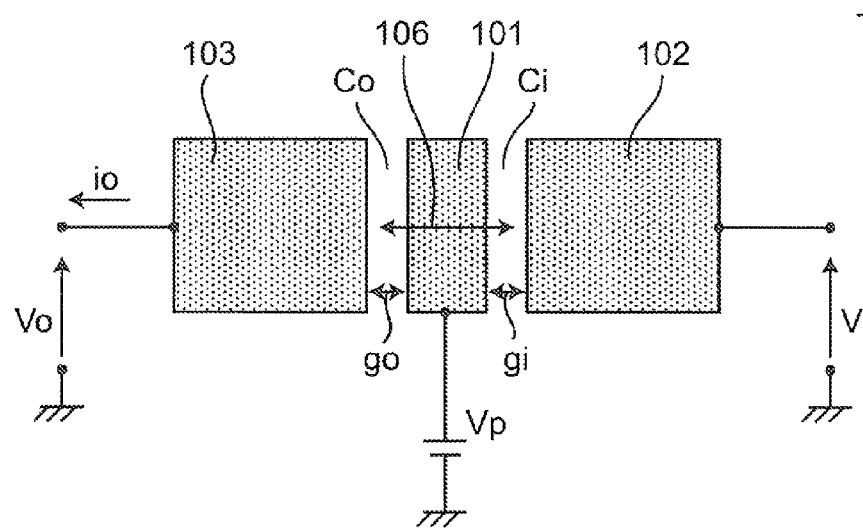
FIG. 17B is a cross-sectional view of the capacitance-type MEMS resonator.

Namely, in order to detect the pressure with a structure as that of the pressure sensor 200 in FIG. 1 or the pressure sensor 300 in FIG. 2, using a so-called capacitance-type MEMS resonator 100 having a vibrator 101 and electrodes 103 and 102 disposed thereon with cavities (gaps) go and gi interposed therebetween in such a way as to form capacitances Co and Ci therebetween for exerting electrostatic forces on the vibrator 101, it is necessary to operate the vibrator 101 in a linear resonance range, in order to make the vibration amplitude of the vibrator 101 sufficiently smaller with respect to the cavities go and gi, within the pressure range which is desired to be detected. This is because, in general, if the vibration amplitude of the vibrator 101 is increased to exceed ⅓ the cavities go and gi, prominent nonlinearity appears in the vibrating motion of the vibrator 101. Therefore, in cases of detecting the pressure with a sensor structure as in FIG. 1 and FIG. 2, the spaces which make up ⅔ the cavities go and gi, in the sides closer to the electrodes 102 and 103 in FIG. 17B, are not used for the vibrations of the vibrator 101.

In view of the aforementioned problem, according to the present embodiment, there is provided a pressure sensor which employs a MEMS resonator and is capable of detecting the pressure within a wider range, based on the change of the vibrations of a vibrator 101, by utilizing cavities go and gi more effectively.

2. First Embodiment

According to the first embodiment, there is provided a pressure sensor which is a pressure sensor employing a MEMS resonator. This pressure sensor is adapted to sweep, in a predetermined direction, the frequency of an excitation signal inputted to the MEMS resonator, further to extract, from the MEMS resonator, a characteristic amount indicative of the vibrating state of a vibrator, at least at two frequencies ("extraction frequencies"), during the sweeping, and further to determine the pressure around the vibrator based on these characteristic amounts.

The aforementioned at least two extraction frequencies include a frequency near the resonance frequency, and a frequency later than this frequency near the resonance frequency in the direction of the sweeping. In this case, the frequency near the resonance frequency refers to a frequency at which the vibrator performs vibrating motion with a maximum vibration amplitude within a linear region (with respect to the change of the frequency of the excitation signal). Thus, the frequency near the resonance frequency is regarded as being substantially coincident with the mechanical resonance frequency of the MEMS resonator. Further, generally, the frequency near the resonance frequency refers to a frequency through which the symmetry axis of the bilateral symmetry in the resonance characteristic within the linear region passes, as "f0" in FIG. 18. Further, it is known that the mechanical resonance frequency (the frequency near the resonance frequency) may exhibit predetermined fluctuations depending on environmental changes (changes in the pressure, the temperature and the like). The direction of sweeping of the frequency of the excitation signal agrees with the direction of the inclination of the peak in the resonance characteristic of the vibrator in the nonlinear region. For example, when there is a dominant effect of capacitive bifurcation in the MEMS resonator, and the peak in the resonance characteristic of the vibrator is inclined (warped) leftwardly (toward a lower-frequency side), in the nonlinear region, as in the resonance characteristic 121 in FIG. 19, the direction of frequency sweeping is the higher-frequency-to-lower-frequency direction. Further, in this case, the frequency later than the frequency near the resonance frequency in the direction of sweeping refers to a frequency lower than the frequency near the resonance frequency. Further, for example, when there is a dominant effect of mechanical bifurcation in the MEMS resonator, and the peak in the resonance characteristic of the vibrator is inclined (warped) rightwardly (toward a higher-frequency side), in the nonlinear region, as in the resonance characteristic 131 in FIG. 20, the direction of frequency sweeping is the lower-frequency-to-higher-frequency direction. Further, in this case, the frequency later than the frequency near the resonance frequency in the direction of sweeping refers to a frequency higher than the frequency near the resonance frequency. Accordingly, the frequencies at which amounts indicative of the vibrating state of the vibrator should be extracted during sweeping, namely the extraction frequencies, are at least two frequencies including a frequency near the resonance frequency of the MEMS resonator, and a frequency later than the frequency near the resonance frequency in the direction of frequency sweeping.

At these respective extraction frequencies, characteristic amounts (vibrating-state information signals) indicative of the vibrating state of the vibrator (for example, the amplitude, the speed of the vibrator, flexures and torsions therein) are extracted from the MEMS resonator. Further, the pressure sensor determines the pressure of the ambient atmosphere, based on the plurality of the characteristic amounts, such as the sum (the integrated value) of the plurality of the extracted characteristic amounts, for example.

By sweeping the frequency of the excitation signal in the aforementioned predetermined direction, as described above, the resonance characteristic of the vibrator is uniquely determined, in consideration of hysteresis therein. Further, since characteristic amounts indicative of the vibrating state of the vibrator are extracted at a plurality of extraction frequencies including a frequency near the resonance frequency, and a frequency later than the frequency near the resonance frequency, these plural characteristic amounts are caused to well reflect the degree of the warpage in the resonance characteristic due to the nonlinear effect. Accordingly, the sum (the integrated value) of the plural characteristic amounts is made to be an amount which changes acutely with respect to the pressure change. Accordingly, the pressure sensor according to the present embodiment is capable of accurately measuring the pressure of the ambient atmosphere, even under pressures which cause the vibrator to operate in the nonlinear region.

Figure 3:
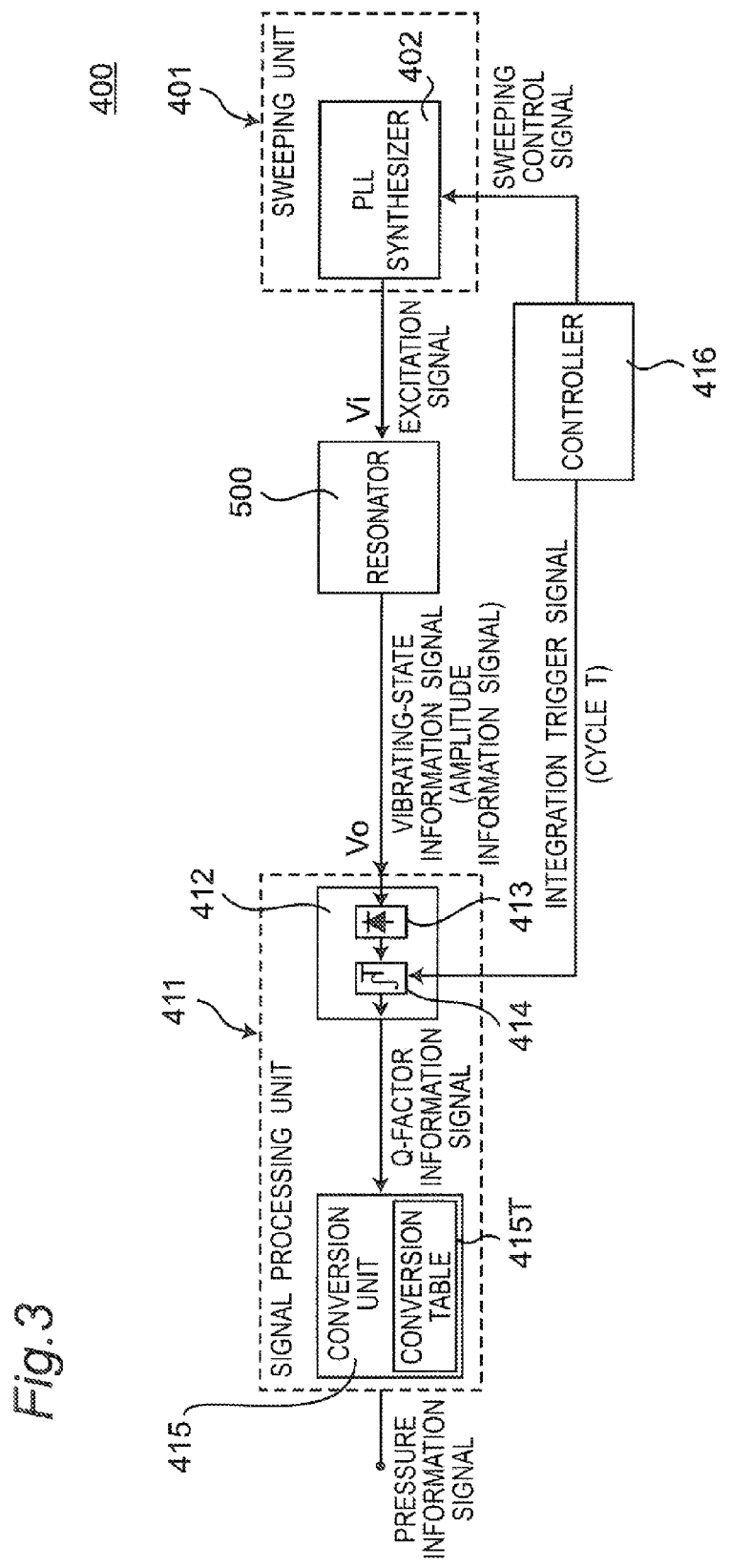
FIG. 3 is a block diagram illustrating the structure of the pressure sensor according to the first embodiment.

FIG. 3 is a block diagram illustrating the structure of a pressure sensor 400 according to the first embodiment. The pressure sensor 400 includes a sweeping unit 401 which is adapted to sweep the frequency of the excitation signal in a predetermined direction and to output the excitation signal (AC voltage) Vi to a resonator 500 while gradually changing the frequency; the MEMS resonator 500 of a so-called capacitance type (with a resonance frequency f0) which exhibits a prominent effect of capacitive bifurcation in a nonlinear region; a signal processing unit 411 which is adapted to extract characteristic amounts (vibrating-state information signals) indicative of the vibrating state of the vibrator, from the resonator 500, and, further, is adapted to determine the pressure P of the ambient atmosphere based on the extracted vibrating-state information signals and to output it as a pressure information signal; and a controller 416 adapted to control the sweeping unit 401 and the signal processing unit 411.

The sweeping unit 401 includes a PLL synthesizer 402 which is controlled by the controller 416. The PLL synthesizer 402 in the sweeping unit 401 performs frequency sweeping from a frequency f1 (f1: f1>f0) to f2 (f2: f2<f0), over a predetermined cycle, according to a sweeping control signal from the controller 416. The repetitive cycles may have an arbitrary predetermined value and are not particularly limited. Further, the sweeping can be either successively repeated or performed intermittently.

The MEMS resonator 500 is adapted such that the excitation signal Vi is inputted thereto, while the excitation signal Vi is subjected to frequency sweeping from the frequency f1 to the frequency f2 (f1>f0>f2). Further, the MEMS resonator 500 is adapted to output a voltage corresponding to the electric current flowing through the output electrode due to the vibrations of the vibrator in the ambient atmosphere according to the excitation signal Vi, as a vibrating-state information signal as a characteristic amount indicative of the vibrating motion. Accordingly, in this case, the vibrating-state information signal is a voltage signal (an amplitude information signal) corresponding to the amplitude of the vibrator.

The signal processing unit 411 includes an integrating unit 412, and a conversion unit 415. The integrating unit 412 includes a wave detector 413 and an integrator 414. The conversion unit 415 includes a conversion table 415T for use in determining the Q factor of the MEMS resonator 500 from a Q-factor information signal which will be described later and, further, for use in determining the pressure of the ambient atmosphere from the determined Q factor.

The wave detector 413 performs envelope detection for the amplitude of the vibrating-state information signal received from the MEMS resonator 500. The integrator 414 operates according to an integration trigger signal from the controller 416 to integrate the output from the wave detector 413 and to output the integrated value to the conversion unit 415. The integrator 414 is capable of integrating the output from the wave detector 413, at predetermined small time intervals (substantially continuously). In this case, this integration is integration over a single cycle of the frequency sweeping by the sweeping unit 401. Accordingly, the integrated value substantially agrees with the vibrating-state information signal from the MEMS resonator 500 (the output from the wave detector 413) which has been time-integrated over a single cycle of sweeping. The integrated value is outputted, as a Q-factor information signal, to the conversion unit 415.

Also, the integrator 414 can intermittently (selectively) integrate the output from the wave detector 413, according to the integration trigger signal, within each cycle, to integrate the vibrating-state information signal from the MEMS resonator 500 only when the excitation signal Vi has a predetermined frequency (out of the aforementioned two or more extraction frequencies). Further, the integrator 414 can output the result of this integration, as a Q-factor information signal, to the conversion unit 415.

The conversion unit 415 makes a reference to the conversion table 415T, regarding the Q-factor information signal received from the integrating unit 412, further determines the Q factor of the MEMS resonator 500, further determines the pressure P of the ambient atmosphere corresponding to the determined Q factor, and outputs a signal including information about the pressure P of the ambient atmosphere (a pressure information signal). The conversion table 415T is a table defining the relationship among the Q-factor information signal, the Q factor of the MEMS resonator 500, and the pressure P of the ambient atmosphere corresponding to the Q factor. The conversion table 415T has been preliminarily determined and stored in the conversion unit 415.

Figure 4A:
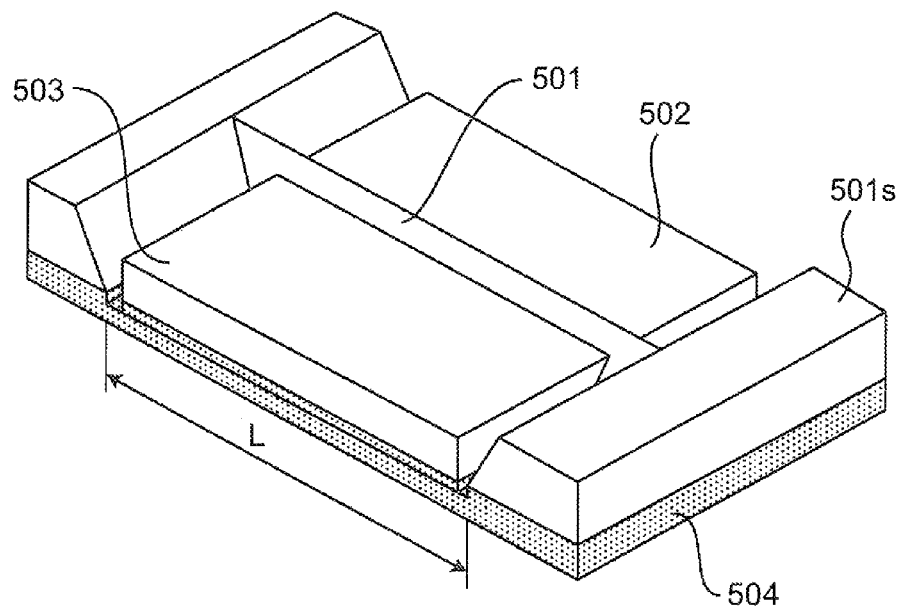
FIG. 4A is a perspective view illustrating the structure of a capacitance-type MEMS resonator.
Figure 4B:
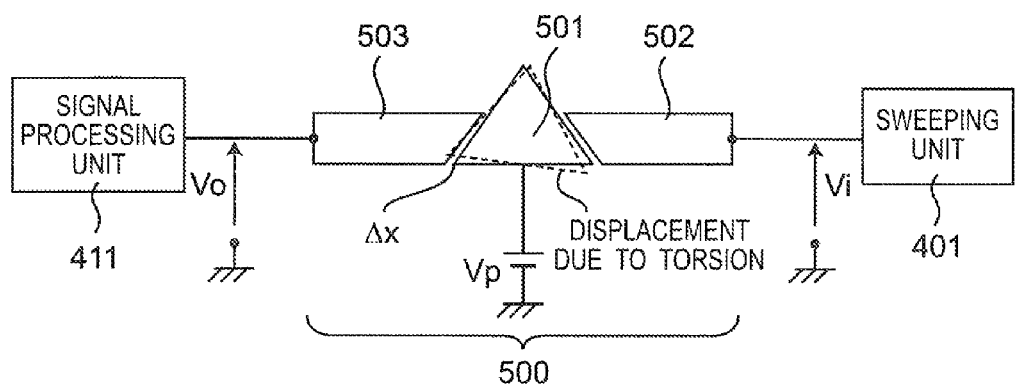
FIG. 4B is a cross-sectional view of the capacitance-type MEMS resonator.

FIG. 4A is a perspective view illustrating the structure of the MEMS resonator 500. It is different from the MEMS resonator 100 illustrated in FIG. 17A, in that a vibrator 501 supported by a vibrator supporting portion 501s has a triangular cross-sectional shape, as illustrated in FIG. 4B. The vibrator 501 performs torsional vibrations such that an approximate center of gravity of the triangular cross section serves as the rotational center. The vibrator 501 has a length of 100 (micrometers) and has a resonance frequency f0 of 20.7456 MHz (in a torsional resonance mode) in a predetermined environment regarding the temperature, the pressure and the like. The structure of such a capacitance-type MEMS resonator (the structure of a resonator adapted to be excited with electrostatic forces and to output an electric current caused by a capacitance change due to vibrations) can be easily fabricated through semiconductor processes and can be suitably integrated into integrated circuits and, therefore, has the advantage of realizing higher integration of the sensor and the sensor signal processing system. Further, the cavities (the gaps) between an electrode 501 and electrodes 502 and 503 have a size of 150 (nm).

Figure 5A:
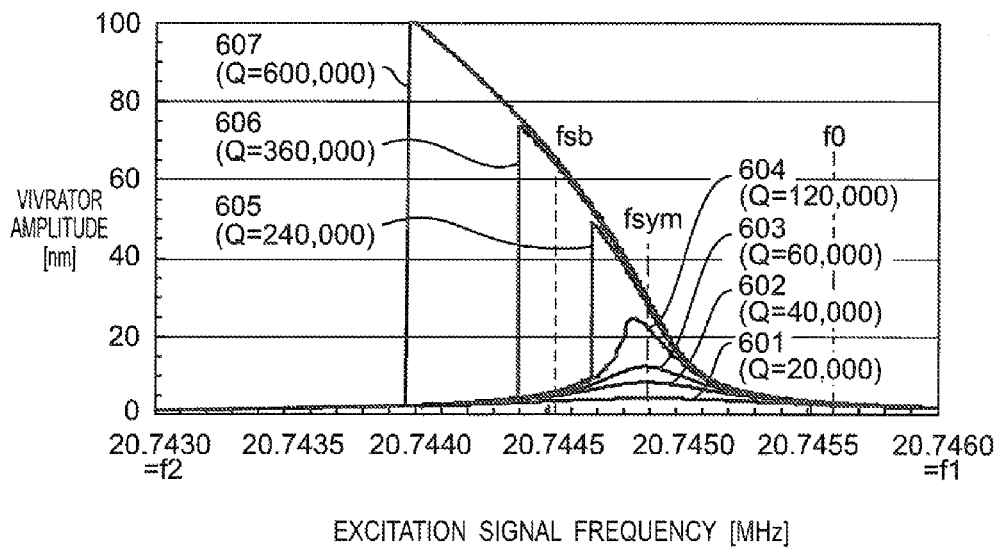
FIG. 5A is resonance characteristics of the vibrator in the MEMS resonator under various pressures.

FIG. 5A is plots (601 to 607) of the vibration amplitude of the vibrator 501, which were resulted from sweeping of the frequency of the excitation signal, in a case where the DC voltage (the bias voltage) Vp applied to the vibrator 501 was set to Vp=1.8 (V), and the voltage Vi (the maximum value) of the excitation signal inputted to the input electrode 502 was set to Vi=20 (mV). In this case, the sweeping starting frequency f1 was set to f1=20.7460 (MHz), and the sweeping completion frequency f2 was set to f2=20.7430 (MHz) (f1>f0>f2). The plots 601 to 607 are plots resulted from measurement under the same conditions except the pressure P of the ambient atmosphere surrounding the vibrator 501. Each of the plots 601 to 607 is associated with an additional remark of the Q factor of the MEMS resonator 500 (which changes with the pressure P at the time of the measurement).

As described above, there is the relationship of Q∝ (proportional to) (1/P), between the Q factor of the MEMS resonator 500 and the pressure P of the ambient atmosphere. Accordingly, some plots having Q factors higher than the Q factors of the other plots indicate that these plots having the higher Q factors are plots resulted from measurement at lower ambient-atmosphere pressures P.

From the plots 601 to 603, it can be seen that, as the pressure P of the ambient atmosphere surrounding the vibrator 501 is decreased, the Q factor of the MEMS resonator 500 increases and, in proportion thereto, the amplitude of the vibrator 501 at the resonance, frequency f0 increases. The plots 601 to 603 have bi-laterally symmetric profiles, like the resonance characteristic 111 in FIG. 18. Namely, the plots 601 to 603 represent resonance characteristics of when the vibrator 501 performs vibrating motion within the linear region. From the plots 601 to 603, it can be seen that, within the linear region, the amplitude of the vibrator 501 around the resonance frequency f0 reacts to the change of the Q factor (the pressure change), relatively acutely.

If the pressure P of the ambient atmosphere is further decreased, the plot starts inclining leftwardly (toward a lower-frequency side), immediately after the Q factor of the MEMS resonator 500 has increased to about 120,000 (the plot 604). Namely, in the MEMS resonator 500, the vibrating motion of the vibrator 501 enters the nonlinear region, immediately after the Q factor has reached about 120,000. Accordingly, the plots 604 to 607 represent resonance characteristics of when the vibrator 501 performs vibrating motion within the nonlinear region. From the plots 605 to 607, it can be seen that, within the nonlinear region, the amplitude of the vibrator 501 around a center frequency fsym (the aforementioned frequency near the resonance frequency) is hardly changed, even if the Q factor is changed (the pressure is changed), wherein, in states where the Q factor is smaller, the resonance waveforms are regarded as being symmetric about the center frequency fsym. Further, regarding the plots 605 to 607, the amplitude values abruptly drop, at frequencies lower than the frequency fsym. As can be indicated by a hysteresis curve 123 in FIG. 19, this dropping indicates a jumping phenomenon specific to the nonlinear region. Such a jumping phenomenon occurs at a frequency which is varied with the Q factor. As the Q factor is increased (as the pressure P of the ambient atmosphere is decreased), the frequency which induces a jump phenomenon shifts to a lower frequency.

Figure 5B:
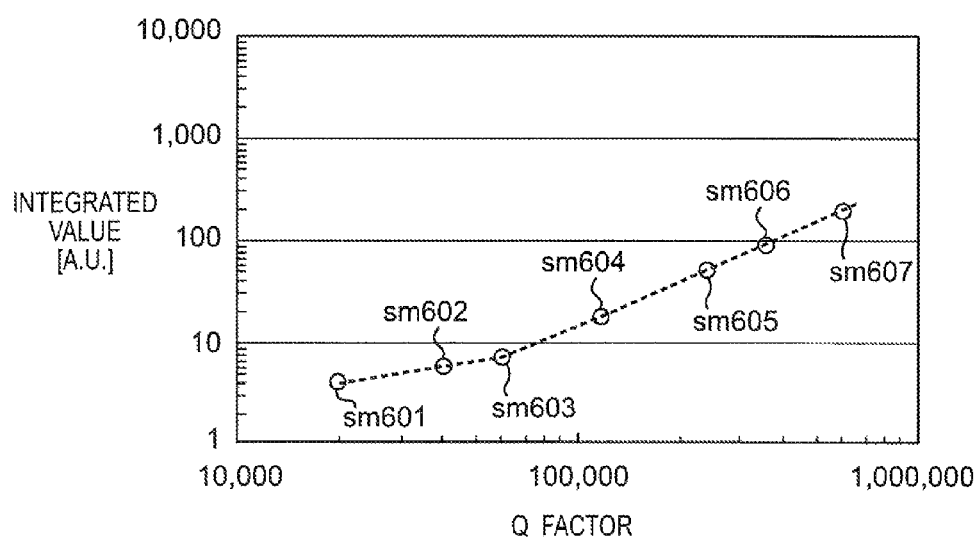
FIG. 5B is a plot of integrated values of the amplitudes of the vibrator at various Q factors.

FIG. 5B is a plot (with points each having a white space on a colored background) of the integrated values (sm601 to sm607) of the amplitude values in the plots 601 to 607, which were resulted from integration over the frequency sweeping from f1 to f2, wherein the respective white-space-and-colored background points are connected to each other, and the horizontal axis represents the Q factor of the MEMS resonator 500. In the figure, the white-space-and-colored background points, and the integrated values sm601 to sm607 represent the integrated values of the amplitude values in the plots 601 to 607 which were resulted from integration over the frequency sweeping, respectively. In this case, the integration was performed at sufficiently-shorter time intervals in comparison with the time required for the frequency sweeping and, as a result thereof, the integrated values sm601 to sm607 sufficiently agree with the respective areas of the regions enclosed by the plots 601 to 607 and the horizontal axis, within the excitation-signal frequency range of f1 to f2, in FIG. 5A.

The line segments connecting the respective points sm601 to sm607 to each other indicate a state where, when the frequency of the excitation signal Vi is swept from f1 to f2, the integrated value of the amplitude value of the vibrator 501 in the MEMS resonator 500 is gradually changed with the change of the Q factor of the MEMS resonator 500 (with the change of the pressure P of the ambient atmosphere). As can be seen from the line segment from the integrated value sm604 to the integrated value sm607, when the sweeping is performed from the frequency f1 to the frequency f2 (f1>f0>f2), the integrated value of the vibration amplitude of the vibrator 501 acutely reacts to the change of the pressure P of the ambient atmosphere, even when the vibrator 501 is operated in the nonlinear region.

In the signal processing unit 411, at first, the integrating unit 412 calculates the integrated value of the vibration amplitude of the vibrator 501 which was resulted from the sweeping from the frequency f1 to the frequency f2 (f1>f0>f2) and, further, outputs this integrated value, as a Q-factor information signal, to the conversion unit 415. Next, the conversion unit 415 determines the Q factor of the MEMS resonator from the integrated value (the Q-factor information signal) and, further, determines the pressure P of the ambient atmosphere, from the determined Q factor, using the conversion table 415T. Further, in this case, it is assumed that the conversion table 415T is a reference table defining the correspondence relationship among the value of the integrated value (the Q-factor information signal), the Q factor, and the pressure P of the ambient atmosphere. However, the aspect of the conversion table 415T is not limited to the form of a reference table. For example, the conversion table 415T can be formed from a calculation algorism for deriving the Q factor and the pressure P of the ambient atmosphere, from the value of the integrated value (the Q-factor information signal).

Further, in cases where an electrostatic method is introduced at least for the excitation of the vibrator 501 or for the vibration-amplitude detection, as in the MEMS resonator 500, it is favorable that the sweeping of the frequency of the excitation signal Vi is performed from a higher frequency than the resonance frequency to a lower frequency than the resonance frequency, for example. This is because, if a prominent nonlinear effect due to capacitive bifurcation appears as in the characteristic 121 in FIG. 19, the resonance characteristic is warped toward a lower-frequency side. In association therewith, FIG. 6 is given for purpose of reference. FIG. 6 illustrates plots 705 and 706 of resonance characteristics resulted from sweeping from a lower frequency than the resonance frequency to a higher frequency than the resonance frequency, in a state where there appeared a prominent nonlinear effect due to capacitive bifurcation. As indicated by a hysteresis curve 125 in FIG. 19, in a state where there appears a prominent nonlinear effect due to capacitive bifurcation, if sweeping is performed from a lower frequency than the resonance frequency to a higher frequency than the resonance frequency, its resonance characteristic exhibits substantially-no variation due to the difference in the Q factor in the MEMS resonator 500. Accordingly, the integrated value of the amplitude of the vibrator 501 which is resulted from the integration throughout the sweeping is less prone to reflect the variation in the pressure P of the ambient atmosphere, and it is extremely hard to accurately determine the pressure P from the integrated value.

Accordingly, in cases where there appears a prominent nonlinear effect due to capacitive bifurcation in the nonlinear region, and the resonance characteristic is warped leftwardly (toward the lower-frequency side), it is favorable that the sweeping of the frequency of the excitation signal Vi is performed from a frequency higher than the resonance frequency to a frequency lower than the resonance frequency, for example. Accordingly, it is favorable that the sweeping starting frequency f1 is equal to or higher than the resonance frequency f0 and, also, the sweeping completion frequency f2 is lower than the resonance frequency f0, for example.

Figure 20:
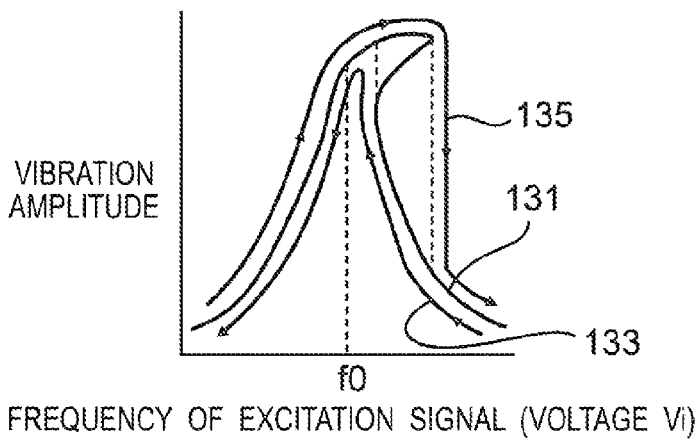
FIG. 20 is a view illustrating resonance characteristics and hysteresis which appear in the nonlinear region.

Further, on the contrary, in cases where there appears a prominent nonlinear effect due to mechanical bifurcation in the nonlinear region, and the resonance characteristic is warped rightwardly (toward the higher-frequency side), as illustrated in FIG. 20, it is favorable that the sweeping of the frequency of the excitation signal Vi is performed from a frequency lower than the resonance frequency to a frequency higher than the resonance frequency, for example. Accordingly, it is favorable that the sweeping starting frequency f1 is equal to or lower than the resonance frequency f0 and, also, the sweeping completion frequency f2 is higher than the resonance frequency f0, for example.

Further, it is possible to sweep the frequency of the excitation signal Vi from a frequency f1 higher than the resonance frequency to a frequency f2 lower than the resonance frequency, further to sweep it from the frequency f2 lower than the resonance frequency to the frequency f1 higher than the resonance frequency, further to integrate the vibration amplitude of the vibrator 501 throughout the repetitive sweeping, and to use this integrated value as a Q-factor information signal, which enables accurately detecting the pressure P of the ambient atmosphere, regardless of which of capacitive bifurcation and mechanical bifurcation is dominant, in the nonlinear region.

As a matter of course, in this case, even if the repetitive sweeping of the frequency of the excitation signal Vi is started from a frequency lower than the resonance frequency, it is possible to accurately detect the pressure P of the ambient atmosphere, regardless of which of capacitive bifurcation and mechanical bifurcation is dominant, in the nonlinear region.

As described above, the pressure sensor 400 according to the present embodiment is adapted to sweep the frequency of the excitation signal Vi inputted to the MEMS resonator 500 in a predetermined direction, further to extract, from the MEMS resonator, characteristic amounts (vibrating-state information signals) indicative of the vibrating state of the vibrator 501 in the MEMS resonator 500, during this sweeping, and to determine the pressure surrounding the vibrator, based on these characteristic amounts. The extracted characteristic amounts include characteristic amounts indicative of the vibrating state at least at two extraction frequencies. The extraction frequencies include the aforementioned frequency near the resonance frequency of the vibrator, and a frequency later than the frequency near the resonance frequency in the direction of sweeping. The frequency near the resonance frequency of the vibrator may be either the resonance frequency of the MEMS resonator 500 (f=f0), or a frequency which is extremely close to the resonance frequency and, also, is earlier than the resonance frequency in the direction of sweeping (f≈f0 and f>f0 (in cases where the direction of sweeping is the higher-frequency-to-lower-frequency direction) or f≈f0 and f<f0 (in cases where the direction of sweeping is the lower-frequency-to-higher-frequency direction)). The extraction frequency later than the frequency near the resonance frequency in the direction of sweeping may be a frequency which is sufficiently deviated from the resonance frequency f0 and, also, is lower than the resonance frequency f0 (f<f0 (in cases where the direction of sweeping is the higher-frequency-to-lower-frequency direction) or f>f0 (in cases where the direction of sweeping is the lower-frequency-to-higher-frequency direction)), as the frequency "fsb" in FIG. 5A, for example.

For example, in cases where two frequencies "fsym" and "fsb" in FIG. 5A are employed as extraction frequencies, the sum of the vibration amplitudes detected at the two extraction frequencies, namely the integrated value of them, is largely varied depending on whether or not the jump (the abrupt drop) in the vibration amplitude of the MEMS resonator 500 occurs at a frequency lower than the frequency "fsb". Accordingly, even when the extraction frequencies are limited to the aforementioned two frequencies, the pressure sensor 400 is enabled to accurately detect the pressure P of the ambient atmosphere, even under pressures which cause the vibrator 501 in the MEMS resonator 500 to vibrate within the nonlinear region.

As described above, the pressure sensor 400 is adapted to extract plural characteristic amounts indicative of the vibrating state of the vibrator 501 at least at two frequencies as described above, during sweeping, and, further, is adapted to determine the pressure based on the integrated value of these characteristic amounts. Therefore, the pressure sensor 400 is capable of accurately determining the pressure of the ambient atmosphere, even when the vibrator 501 in the MEMS resonator 500 is performing vibrating motion within the nonlinear region. As a matter of course, it is possible to expect a widened detectable pressure range and improved pressure detection accuracy, as the number of extraction frequencies is increased.

Further, the speed (df/dt) of the frequency sweeping is not limited. It is possible to make df/dt constant over the entire frequency sweeping range. Also, it is possible to change df/dt in a predetermined portion within the frequency sweeping range. For example, it is possible to continuously integrate the amplitude of the vibrator 501 at constant time intervals throughout frequency sweeping to create an integrated value (Q-factor information signal), while variably controlling df/dt within a pressure range desired to be detected particularly accurately. By doing this, it can be expected that the integrated value (the Q-factor information signal) reflects, more acutely and accurately, the change of the Q factor of the MEMS resonator, within a certain pressure range.

Further, by performing frequency sweeping, further determining characteristic amounts indicative of the vibrating state of the vibrator at plural frequencies of the excitation signal during this sweeping, and further integrating the determined characteristic amounts for determining the pressure, as in the present embodiment, rather than through an excitation signal with a single frequency, it is possible to realize a pressure sensor with higher resistance to the change of the temperature of the ambient atmosphere.

For example, in cases of employing a vibrator made of silicon, its resonance frequency is changed at a rate of about −20 ppm/degree (C.), due to temperature characteristics of the elastic modulus of the vibrator. For example, assuming that a temperature change of 100 degrees (C.) is permitted for a vibrator with a resonance frequency of about 20 MHz, its resonance frequency is varied by about 40 kHz, between a highest temperature and a lowest temperature. Therefore, conventional methods for inducing excitation at a single frequency cannot cope with this temperature change, at all. Although the frequency sweeping range illustrated in FIG. 5A is 3 kHz, it is possible to widen the frequency sweeping range to 40 kHz or more, which enables obtaining the integrated value, without missing its resonance out of the frequency sweeping range, namely in such a way that the resonance state falls within the range of integration. Namely, by determining the frequency sweeping range, based on the product of the temperature characteristic of the elastic modulus of the vibrator and the range of the temperature change estimated in the pressure-sensor-use environment, it is possible to obtain the integrated value, without missing its resonance out of the frequency sweeping range, namely in such a way that the resonance state falls within the range of integration. Also, even when the frequency sweeping range is fixed to a narrow range of about 3 kHz as in FIG. 5A, by adaptively controlling the sweeping starting frequency f1 based on temperature information, using a thermometer, it is possible to attain integration for the resonance curve without missing the resonance state out of the frequency sweeping range.

Further, the present pressure sensor 400 is also effective in coping with nonlinear phenomena caused by mechanical bifurcation which exhibits resonance characteristics like a resonance characteristic 131 in FIG. 20, as well as in coping with nonlinear phenomena caused by capacitive bifurcation which exhibits polarity characteristics like the resonance characteristic 121 in FIG. 19. Such mechanical bifurcation is a phenomenon in which the resonance curve is inclined toward higher frequencies, like the resonance characteristic 131 in FIG. 20, due to nonlinearity of the spring characteristic of the vibrator. Such nonlinearity of the spring characteristic of the vibrator is a phenomenon which is induced when the vibration amplitude is made relatively larger. In structures having electrodes placed oppositely to a vibrator in such a way as to inhibit the vibrations thereof, as those of the capacitance-type MEMS resonators 100 and 500 illustrated in FIG. 17A and FIG. 4A, such nonlinearity of the spring characteristic of the vibrator is less prone to occur (since the nonlinear effect caused by capacitive bifurcation exceeds the nonlinear effect caused by mechanical bifurcation).

Figure 7:
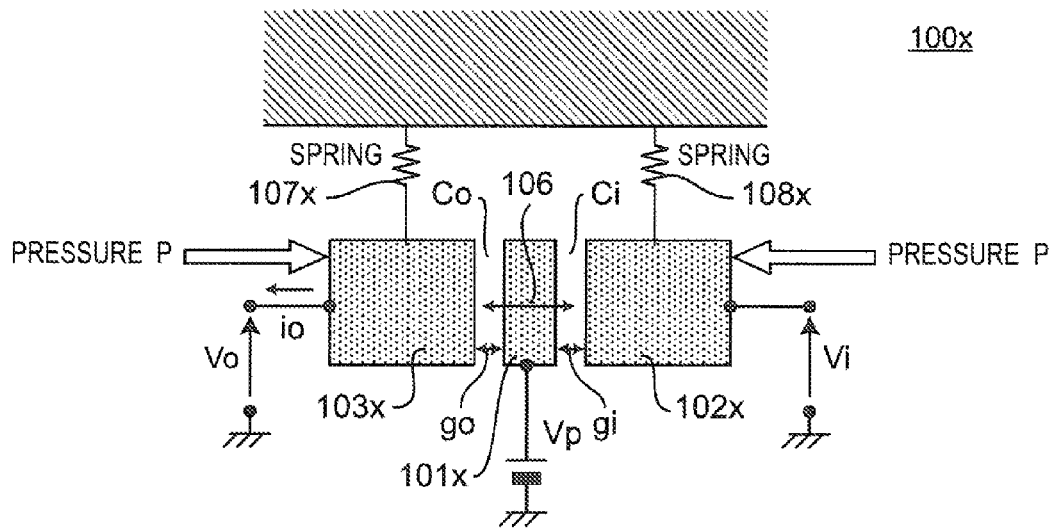
FIG. 7 is a cross-sectional view of a capacitance-type MEMS resonator.

Further, applications of the principle of the present pressure sensor are not limited to the pressure sensor 400 for detecting the pressure change in the ambient gas surrounding the vibrator 501. The present principle can be also applied to pressure sensors of types which are adapted to change the gap lengths between a vibrator and electrodes according to the pressure outside the sensor (such as a fluid pressure or a pressing pressure). FIG. 7 illustrates a conceptual view of a MEMS resonator for use in such a pressure sensor. FIG. 7 is a cross-sectional view of a MEMS resonator 100x formed by providing mechanism for changing the gap(s) go and/or gi on receiving a pressure P (such as a fluid pressure or a pressing pressure), in the capacitance-type MEMS resonator 100 in FIG. 17B. The MEMS resonator 100x includes electrodes 102x and 103x, which are supported by members having a spring characteristic and, therefore, can be displaced on receiving a force such as the pressure P. Namely, in this case, the mechanism for changing the gap(s) go and/or gi on receiving the pressure P is constituted by the members which have the spring characteristic and support the electrode 102x and/or the electrode 103x. Due to the pressure P outside the sensor (a fluid pressure or a pressing pressure), the electrodes 102x and 103x provided with the spring characteristic (expressed by springs 107x and 108x) are displaced, which results in changes of the gaps go and gi depending on the pressure P. Namely, in the MEMS resonator 100x, due to the action of the mechanism for changing the gap(s) go and/or gi on receiving the pressure P, the capacitance Ci formed by the vibrator 101x and the electrode 102x and the capacitance Co formed by the vibrator 101x and the electrode 103x are changed in magnitude, depending on the pressure P. When the vibrator 101x is performing vibrating motion within a linear resonance range, if the gap intervals are reduced by being subjected to the action of the pressure P, the vibrating motion of the vibrator 101x enters a nonlinear resonance range. According to the present embodiment, by sweeping the frequency of the excitation signal from a higher value to a lower value, within the nonlinear region, and further by integrating the vibrating-state information signal, it is possible to detect the pressure P.

Figure 8:
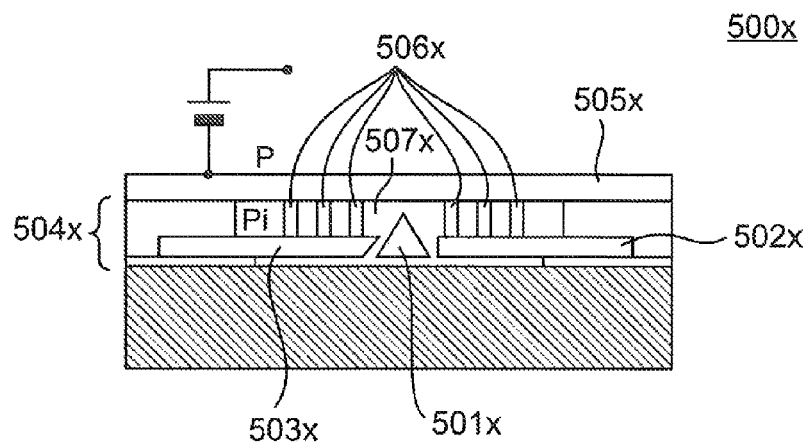
FIG. 8 is a cross-sectional view of the capacitance-type MEMS resonator.

FIG. 8 illustrates an example of a more detailed structure of a MEMS resonator of a type which is adapted to change the gap lengths between a vibrator and electrodes depending on the pressures outside the sensor (such as a fluid pressure or a pressing pressure). The MEMS resonator 500x in FIG. 8 is a torsional resonator having a beam with a triangular cross section, similarly to the MEMS resonator 500 in FIG. 4. A vibrator 501x, and electrodes 502x and 503x are enclosed in a closed space 507x which is formed by partition-wall layers 504x and a diaphragm 505x. The pressure Pi in the closed space 507x is maintained constant. By bringing the pressure Pi in the closed state into a vacuum state, particularly, the vibrator 501x is enabled to resonate with a higher Q factor without being subjected to the viscous drag of gas. If the pressure P (the fluid pressure or pressing pressure) acting on the diaphragm 505x from the outside of the closed space 507x is increased, this causes a flexure in the diaphragm 505x, and this flexure causes flexures in the electrodes 502x and 503x through pillars 506x. Namely, in this case, the mechanism for changing the gaps on receiving the pressure P is constituted by the diaphragm 505x which is subjected to the outside pressure P, and the pillars 506x interposed between the diaphragm 505x and the electrode 502x and/or the electrode 503x. The flexure in the electrode 503x narrows the gap between the electrode 503x and the vibrator 501x, which changes the degree of the nonlinearity in the resonance vibrations of the vibrator 501x. There is a constant correspondence relationship (for example, a proportional relationship) between the amounts of flexures in the electrodes 502x and 503x, and the amount of flexure in the diaphragm 505x. Further, the electrode 502x is made to form, between it and the vibrator 501x, a gap wider enough to make the actions of electrostatic forces negligible, in comparison with the electrode 503x. The structure for inputting and outputting signals is constituted by only the electrode 503x and the vibrator 501x, as will be described later with reference to FIG. 13. There is provided the electrode 502x which performs no function of an electrode, in order to induce bilaterally-symmetric flexures and displacements of the diaphragm 505x due to the pressure P.

Figure 9:
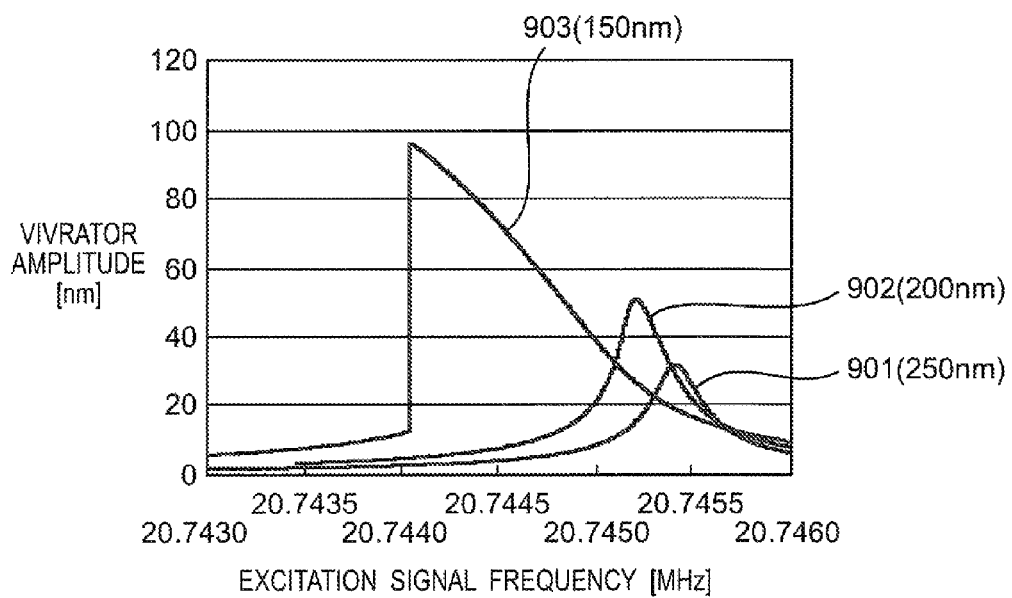
FIG. 9 is resonance characteristics of the vibrator in the MEMS resonator when it has various gap intervals.

FIG. 9 is a graph illustrating plots 901, 902 and 903 of the vibration amplitude of the vibrator 501x, which were resulted from sweeping of the frequency of the excitation signal from a higher value to a lower value, in a case where the DC voltage (the bias voltage) Vp applied to the vibrator 501x was set to Vp=1.8 (V), and the voltage Vi (the maximum value) of the excitation signal inputted to the input electrode 503x was set to Vi=100 (mV). These plots 901, 902 and 903 are plots resulted from measurements under the same conditions, except the gap interval between the vibrator 501x and the electrode 503x. The plots 901, 902 and 903 are plots of the vibrator amplitudes of when the gap interval was 250 (nm), 200 (nm) and 150 (nm), respectively. As can be clearly seen from the figure, provided that the other conditions than the gap interval are the same, the resonance characteristic exhibits stronger nonlinearity, as the gap is gradually narrowed, in the order of 250 nm, 200 nm and 150 nm.

For example, as long as the amplitude is observed at a single frequency around f=20.7454 MHz, the plot 901 (the gap interval=250 (nm)) and the plot 902 (the gap interval=200 (nm)) represent amplitudes equivalent to each other, and it is impossible to detect the gap-interval difference therebetween, from the amplitude values obtained by this observation.

However, by sweeping the frequency of the excitation signal and further integrating the amplitudes measured during the sweeping, these integrated values exhibit an obvious difference therebetween, due to the gap-interval difference.

Figure 10:
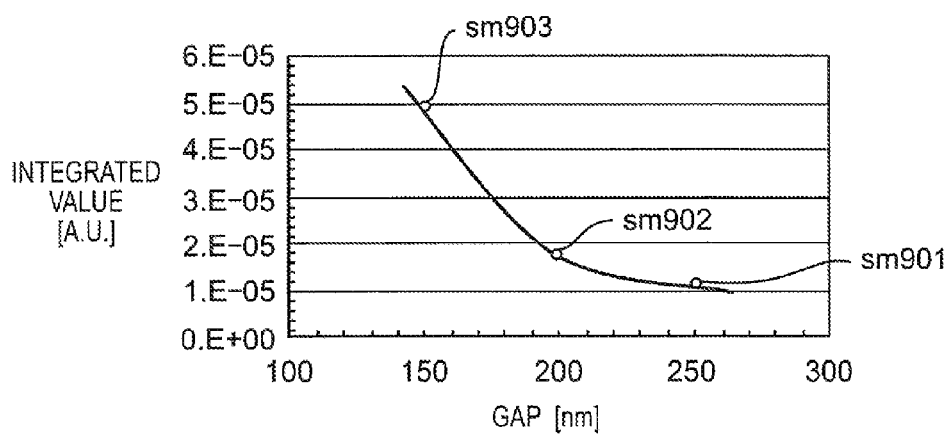
FIG. 10 is a plot of integrated values of the amplitudes of the vibrator when it has various gap intervals.

FIG. 10 is a view illustrating the result of integration of the amplitudes, in a case where the frequency of the excitation signal was swept, between a frequency f1=20.7460 (MHz) and a frequency f2=20.7430 (MHz). An integrated value sm901 represents the integrated value of the amplitude, in the case where the frequency of the excitation signal was swept between f1 and f2, regarding the plot 901 (the gap interval=250 (nm)). An integrated value sm902 represents the integrated value of the amplitude, in the case where the frequency of the excitation signal was swept similarly, regarding the plot 902 (the gap interval=200 (nm)). An integrated value sm903 represents the integrated value of the amplitude, in the case where the frequency of the excitation signal was swept similarly, regarding the plot 903 (the gap interval=150 (nm)). As described above, the value of the amplitude which has been integrated throughout the sweeping of the frequency of the excitation signal is largely changed with the change of the size of the gap between the vibrator 501$x$ and the electrode 503$x$. Accordingly, by utilizing information about such integration, it is possible to easily detect the difference among the gaps 250 nm, 200 nm and 150 nm.

As described above, according to the present embodiment, by employing the MEMS resonator structured such that the gap between the vibrator and the electrode is well corresponding to the pressure to be measured, similarly, it is possible to widely measure this pressure. In this case, it is preferable to preliminarily determine the relationship between the gap interval and the integrated value of vibrating-state information (for example, the amplitude) throughout sweeping, and the relationship between the gap interval and the pressure, and it is preferable to store these relationships in a conversion table 415T in a conversion unit 415. Further, in this case, similarly, the conversion table 415T is not limited to a reference table defining the correspondence relationship among the value of the integrated value, the gap interval and the pressure P. For example, the conversion table 415T can be formed from a calculation algorism for deriving the gap interval and the pressure P of the ambient atmosphere, from the value of the integrated value.

3. Modification Examples

3-1. Example of Modification of the Signal Processing Unit

Figure 11:
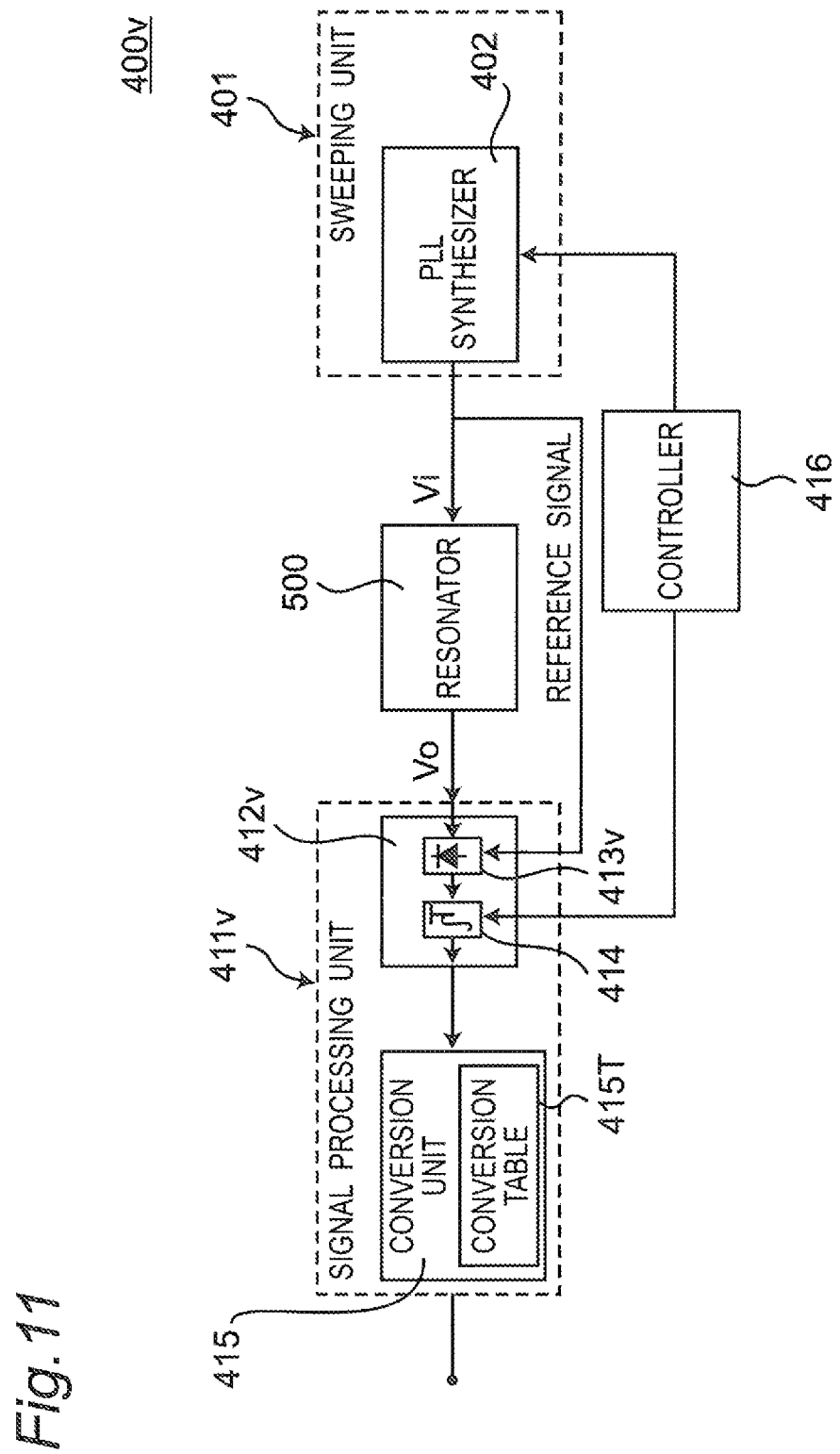
FIG. 11 is a block diagram illustrating the structure of a modification example of the pressure sensor according to the first embodiment.

FIG. 11 is a block diagram illustrating the structure of a modification example of the pressure sensor 400. In the modification example 400$v$, a signal processing unit 411$v$ includes an integrating unit 412$v$ having a different structure from that in the pressure sensor 400. The integrating unit 412$v$ includes a wave detector 413$v$ capable of synchronous wave detection. The wave detector 413$v$ is supplied with frequency information, as a reference signal, from a PLL synthesizer 402. This improves the accuracy of the wave detection by the integrating unit 412$v$, which creates an expectation for improvement of the quality of the integrated value (Q-factor information signal). This creates an expectation for further improvement of the accuracy of the pressure measurement.

3-2. Examples of Modification of the MEMS Resonator

The MEMS resonator included in the pressure sensor according to the present embodiment is not limited to a capacitance-type MEMS resonator 500 adapted to resonate in a torsional vibration mode, as illustrated in FIG. 4A.

As the MEMS resonator in the pressure sensor according to the present embodiment, it is also possible to employ a capacitance-type MEMS resonator 100 which includes a vibrator 101 of a both-ends-supported beam type and is adapted to resonate in a flexural vibration mode, as illustrated in FIG. 17A.

Further, the vibrator is not limited to a both-ends-supported beam, such as the vibrators 101 and 501. It is also possible to employ any of vibrators having various forms, such as those of cantilever-beam types, disk types, ring types, square types, as the vibrator in the MEMS resonator in the pressure sensor according to the present embodiment.

The vibration mode excited in the vibrator in the MEMS resonator through inputting of excitation signals can be any vibration mode, such as a flexural vibration mode, a torsional vibration mode.

The method for fabricating the MEMS resonator is not limited to a method which employs an SOI substrate.

3-3. Examples of Vibrating-State Information Signals

The signal processing unit 411 can be adapted such that other information than information about the amplitude of the vibrator 501 is inputted thereto, as vibrating-state information. Further, the signal processing unit 411 can be also adapted to integrate the inputted information to create a Q-factor information signal.

Figure 12:
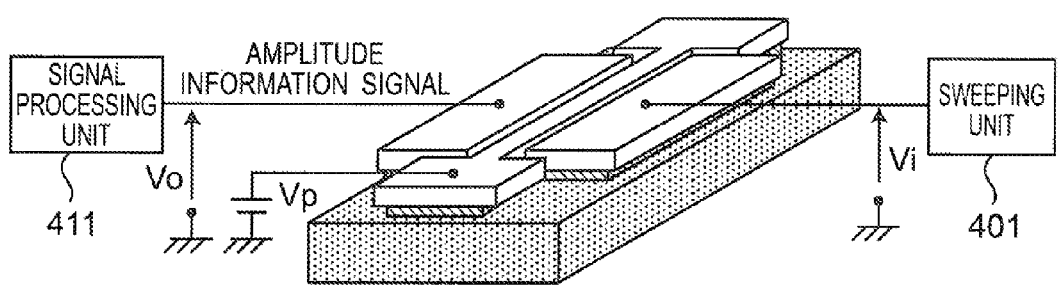
FIG. 12 is a view illustrating an example of outputting of a vibrating-state information signal (amplitude information signal).

FIG. 12 is an example of a structure for outputting, as vibrating-state information, an electric current flowing through an output electrode due to the vibrations of a vibrator (a voltage corresponding thereto (amplitude information signal)), in a MEMS resonator adapted to resonate in a flexural vibration mode as in FIG. 17A. The structure illustrated in this figure is substantially the same as the structure illustrated in FIG. 4A and FIG. 4B, except that the vibrator performs resonant vibrations in a different vibration mode.

Figure 13:
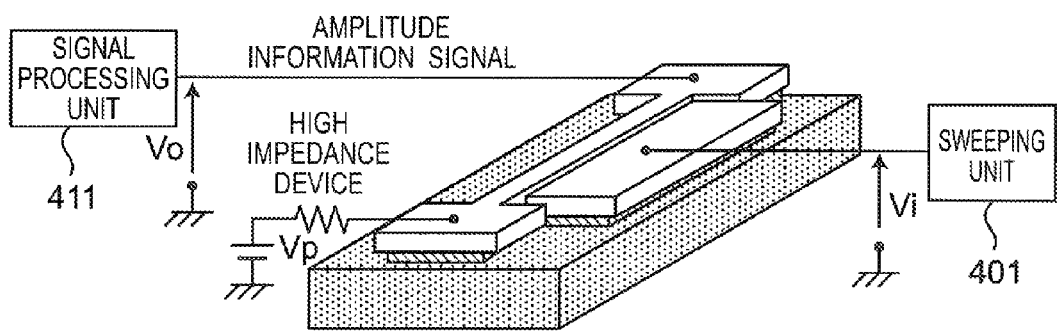
FIG. 13 is a view illustrating an example of outputting of the vibrating-state information signal (amplitude information signal).

Further, as illustrated in FIG. 13, the vibrator can be connected to a bias voltage source with a high impedance device interposed therebetween, such that the vibrator is caused to perform the function of an output electrode, and an electric current flowing therein due to vibrations of the vibrator (a voltage corresponding thereto (amplitude information signal)) can be extracted from the vibrator, as vibrating-state information.

Figure 14:
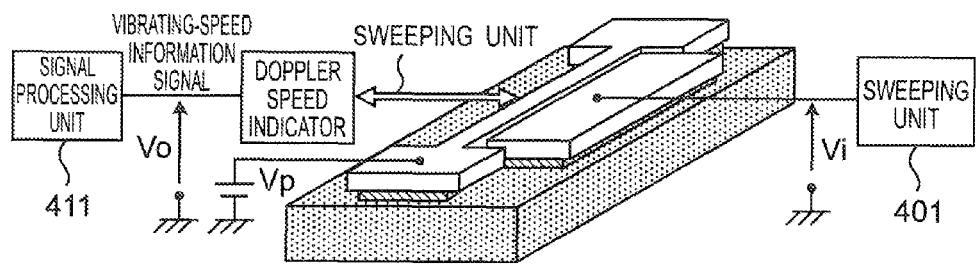
FIG. 14 is a view illustrating an example of outputting of a vibrating-state information signal (vibrating-speed information signal).

Further, the vibrating-state information signal is not limited to a signal created by a displacement current which is flowed along with a capacitance change. FIG. 14 is a view illustrating a structure for optically detecting the speed of the vibrations of a vibrator and for outputting a signal of information about the vibrating speed of the vibrator, as vibrating-state information. In the present example, a Doppler interferometer (speed indicator) is further provided for detecting the vibrating speed of the vibrator. Information about the detected vibrating speed is outputted, as vibrating-state information signal (vibrating-speed information signal (AC voltage Vo)), to the signal processing unit 411.

Figure 15:
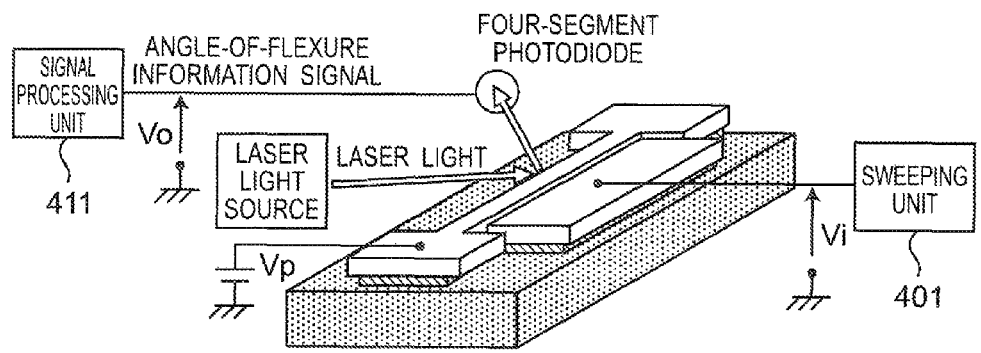
FIG. 15 is a view illustrating an example of outputting of a vibrating-state information signal (angle-of-flexure information signal).

Also, the vibrating-state information signal can be information about flexures in the vibrator. FIG. 15 is a view illustrating a structure which includes a laser light source and, further, is adapted to direct laser light from the laser light source to a vibrator and to receive reflected laser light by a four-segment photodiode, for detecting the angle of flexure in the vibrator. In the present example, the degree of flexure in the vibrator (the angle of flexure) is detected by the four-segment photodiode, and information about the detected angle of flexure is outputted, as vibrating-state information signal (angle-of-flexure information signal), to the signal processing unit 411. Further, the number of segments in the photodiode for detecting the angle of flexure in the vibrator is not limited to four. It is possible to employ such a photodiode which is segmented in an arbitrary number of parts, as the photodiode for detecting the angle of flexure in the vibrator.

As described above, the vibrating-state information signal to be inputted to the signal processing unit 411 is not limited to a vibrator-amplitude information signal. The vibrating-state information signal is required only to include information which well reflects characteristics of the vibrating motion of the vibrator (the amplitude, the speed and the like of the vibrations).

Figure 16:
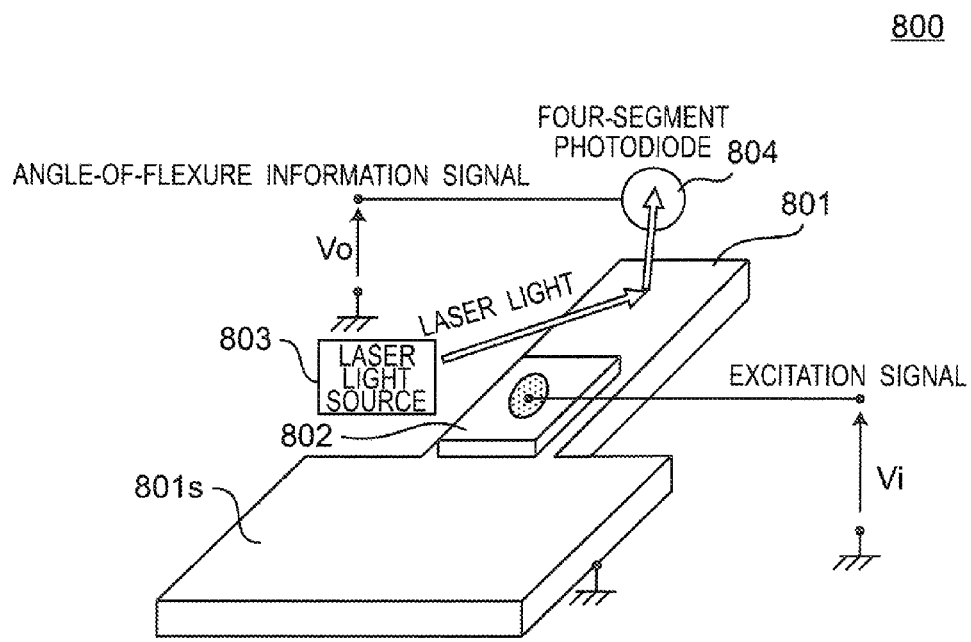
FIG. 16 is a perspective view illustrating the structure of a non-capacitance type MEMS resonator.

3-4. Examples of a MEMS Resonator which Exhibits Prominent Mechanical Bifurcation FIG. 16 is a view illustrating an example of a MEMS resonator which is not of a capacitance type (a non-capacitance-type MEMS resonator). A MEMS resonator 800 is structured to include a cantilever beam 801 and a supporting portion 801s which are made of silicon, wherein the supporting portion 801s is secured to a substrate portion, which is not illustrated. A piezoelectric device 802 is mounted on the cantilever beam 801 near its end portion closer to the supporting portion 801s, and an excitation signal is applied to the piezoelectric device 802. Thus, the cantilever beam performs vibrating motion according to the excitation signal. Laser light emitted from a laser light source 803 is reflected by the cantilever beam and is received by a four-segment photodiode 804. The four-segment photodiode 804 detects the angle of flexure in the cantilever beam 801 along with its vibrations and, further, outputs an angle-of-flexure information signal. The angle-of-flexure information signal is inputted, as a vibrating-state information signal, to a signal processing unit 411, which is not illustrated. Further, the number of segments in the photodiode for detecting the angle of flexure in the cantilever beam 801 is not limited to four. It is possible to employ such a photodiode which is segmented in an arbitrary number of parts, as the photodiode for detecting the angle of flexure in the cantilever beam 801.

In the MEMS resonator 800 having the aforementioned structure, if the amplitude of the cantilever beam (the vibrator) 801 is increased, it exhibits a nonlinear effect due to mechanical bifurcation. Therefore, its resonance characteristic is warped rightwardly (toward a higher-frequency side), like the resonance characteristic 131 in FIG. 20. In cases where there appears a characteristic as in FIG. 20 in the nonlinear region, it is preferable to sweep the frequency of the excitation signal from a frequency lower than the resonance frequency (a frequency near the resonance frequency) to a frequency higher than the resonance frequency (a frequency near the resonance frequency), further, to integrate the vibrating-state information signal (for example, an angle-of-flexure information signal) outputted from the MEMS resonator 800 during the sweeping to determine a Q-factor information signal and, further, to determine the pressure P of the ambient atmosphere from this Q-factor information signal.

Further, although, in FIG. 16, the piezoelectric device 802 is employed as a device for distorting the vibrator 801 according to the excitation signal, the device for distorting it is not limited to the piezoelectric device 802. For example, the device for distorting it can be constituted by a magnetostrictor. Further, the vibrator 801 is not limited to a cantilever-beam type and can be of a both-ends-supported beam type. In this case, an AC electric current can be inputted to the both-ends-supported beam for exerting an outside static magnetic field thereon such that the outside static magnetic field penetrates the beam, in order to excite the vibrator through the Lorentz force.

Further, it is also possible to utilize optical excitation through a photothermal effect. By performing, on the vibrator, spot irradiation with condensed flashing laser light, it is possible to heat the vibrator at the spot portion for inducing a distortion therein, which excites the vibrator.

Further, the method for creating and outputting vibrating-state information signals is not limited to a method utilizing a four-segment photodiode. For example, by employing a piezoresistive device or a piezoelectric device which is formed on the vibrator, it is possible to output distortions of the vibrator along with the vibrations thereof, as electric signal changes.

INDUSTRIAL APPLICABILITY

The sensor employing the MEMS resonator according to the present embodiment is capable of accurately measuring the pressure over a wider range and, therefore, is usable as a pressure sensor.

REFERENCE SIGNS LIST

100: Capacitance-type MEMS resonator
100x: Capacitance-type MEMS resonator
101: Vibrator
101x: Vibrator
102: Input electrode
102x: Input electrode
103: Output electrode
103x: Output electrode
107x: Springy member
108x: Springy member
400: Pressure sensor
401: Sweeping unit
402: PLL synthesizer
411: Signal processing unit
412: Integrating unit
413: Wave detector
414: Integrator
415: Conversion unit
415T: Conversion table
416: Controller
500: Capacitance-type MEMS resonator
500x: Capacitance-type MEMS resonator
501: Vibrator
501x: Vibrator
501s: Vibrator supporting portion
502: Input electrode
502x: Electrode
503: Output electrode
503x: Input electrode
504x: Partition-wall layer
505x: Diaphragm
506x: Pillar
507x: Closed space
800: Non-capacitance-type MEMS resonator
801: Vibrator (Cantilever beam)
801s: Supporting portion
802: Piezoelectric device
803: Laser light source
804: Four-segment photodiode

The invention claimed is:

1. A pressure sensor employing a MEMS resonator, comprising:
    a MEMS resonator;
    a sweeping unit which sweeps a frequency of an excitation signal in a predetermined direction of sweeping, over a predetermined frequency range including a resonance frequency f0 of a vibrator in the MEMS resonator, while outputting the excitation signal to the MEMS resonator;
    an integrating unit which inputs a vibrating-state information signal as a characteristic amount indicative of a vibrating state of the vibrator from the MEMS resonator while the sweeping unit sweeps the frequency, integrates a plurality of the vibrating-state information signals at different frequencies of the excitation signal, and outputs the integrated value; and
    a conversion unit which determines a pressure acting on the MEMS resonator, based on the integrated value.

2. The pressure sensor according to claim 1, wherein
the integrating unit determines the integrated value, by integrating at least two vibrating-state information signals including a vibrating-state information signal of when the excitation signal has a frequency earlier than the resonance frequency f0 in the direction of sweeping, and a vibrating-state information signal of when the excitation signal has a frequency later than the resonance frequency f0 in the direction of sweeping.

3. The pressure sensor according to claim 2, wherein
the MEMS resonator comprises a capacitance-type MEMS resonator, and
the sweeping unit performs the sweeping in such a direction that the frequency of the excitation signal is gradually lowered, from a sweeping starting frequency f1 which is a frequency equal to or higher than the resonance frequency f0, to a sweeping completion frequency f2 which is a frequency lower than the resonance frequency f0.

4. The pressure sensor according to claim 3, wherein
the vibrator in the capacitance-type MEMS resonator is surrounded by an ambient atmosphere at a pressure equal to the pressure acting on the MEMS resonator, and
the conversion unit determines a Q factor of the MEMS resonator based on the integrated value and determines the pressure based on the determined Q factor.

5. The pressure sensor according to claim 3, wherein
the capacitance-type MEMS resonator includes:
a vibrator;
an electrode disposed in such a way as to interpose a gap between the electrode and the vibrator; and
a mechanism which changes a size of the gap according to the magnitude of the pressure acting on the capacitance-type MEMS resonator, and
the conversion unit determines the size of the gap based on the integrated value and determines the pressure based on the determined size of the gap.

6. The pressure sensor according to claim 2, wherein
the vibrating-state information signal comprises a signal including information about a vibration amplitude of the vibrator.

7. The pressure sensor according to claim 2, wherein
the vibrating-state information signal comprises a signal including information about a vibrating speed of the vibrator.

8. The pressure sensor according to claim 2, wherein
the vibrating-state information signal comprises a signal including information about an angle of flexure in the vibrator along with vibrating motion of the vibrator.

9. The pressure sensor according to claim 3, wherein
an absolute value of the difference between the sweeping starting frequency f1 and the sweeping completion frequency f2 is preliminarily determined, based on the product of a temperature characteristic of the elastic modulus of the vibrator and a temperature changing range expected in a pressure-sensor-use environment.

10. The pressure sensor according to claim 2, wherein
the MEMS resonator comprises a non-capacitance-type MEMS resonator, and
the sweeping unit performs the sweeping in such a direction that the frequency of the excitation signal is gradually heightened, from a sweeping starting frequency f1 which is a frequency equal to or lower than the resonance frequency f0, to a sweeping completion frequency f2 which is a frequency higher than the resonance frequency f0.

* * * * *